United States Patent [19]

Biermann et al.

[11] Patent Number: 4,994,139
[45] Date of Patent: Feb. 19, 1991

[54] METHOD OF MANUFACTURING A LIGHT-CONDUCTING DEVICE

[75] Inventors: Udo K. P. Biermann; Gijsbertus A. C. M. Spierings; Franciscus J. H. M. van der Kruis; Jan Haisma, all of Eindhoven, Netherlands

[73] Assignee: U.S. Philips Corp., New York, N.Y.

[21] Appl. No.: 504,727

[22] Filed: Apr. 3, 1990

Related U.S. Application Data

[63] Continuation of Ser. No. 394,686, Aug. 16, 1989, abandoned.

[30] Foreign Application Priority Data

Aug. 16, 1988 [NL] Netherlands .................. 8802028

[51] Int. Cl.$^5$ .................. H01L 21/306; B44C 1/22; C03C 15/00; C03C 25/06
[52] U.S. Cl. .................. 156/630; 156/636; 156/645; 156/651; 156/655; 156/663
[58] Field of Search .............. 156/630, 633, 636, 637, 156/639, 645, 651, 655, 662, 663; 51/317, 318, 283 R

[56] References Cited

U.S. PATENT DOCUMENTS

| 4,285,714 | 8/1981 | Kirkpatrick | 65/40 |
| 4,310,583 | 12/1982 | Baker et al. | 156/630 X |
| 4,436,580 | 3/1984 | Boyd et al. | 156/636 |
| 4,554,717 | 11/1985 | Vig et al. | 156/636 X |

FOREIGN PATENT DOCUMENTS

| 0209173 | 1/1987 | European Pat. Off. . |
| 0225558 | 6/1987 | European Pat. Off. . |
| 0297652 | 1/1989 | European Pat. Off. . |
| 0337556 | 10/1989 | European Pat. Off. . |

Primary Examiner—William A. Powell
Attorney, Agent, or Firm—Ernestine C. Bartlett

[57] ABSTRACT

An optical device is manufactured by providing a disc-shaped body of a light-conducting material on a plane surface of a disc-shaped carrier body, grinding the light-conducting material mechanically to a thickness which exceeds the desired ultimate layer thickness by at least 50 $\mu$m, subjecting the light-conducting material to alternate tribochemical and mechanical polishing treatments until a thickness is obtained which exceeds the desired ultimate layer thickness by approximately 10 $\mu$m, and subsequently polishing the light-conductor body tribochemically until the desired layer thickness is obtained.

11 Claims, 1 Drawing Sheet

METHOD OF MANUFACTURING A LIGHT-CONDUCTING DEVICE

This is a continuation of application Ser. No. 07/394,686, filed Aug. 16, 1989, abandoned.

FIELD OF THE INVENTION

The invention relates to a method of manufacturing a device, in which a layer of a light-conducting material is applied to a plane surface of a disc-shaped carrier body.

BACKGROUND OF THE INVENTION

United States Patent Specification US 4285714 describes a method in which a glass plate is connected to, for example, a semiconductor body by means of electrostatic bonding at a temperature in excess of the softening temperature of the glass. The electric potential applied amounts to approximately 1000 V at a temperature from 450° to 800° C. In the bonding process, the parts to be interconnected are brought into contact with each other under pressure.

The high temperature and the high electric voltage render this known method unsuitable for the manufacture of a device which prior to bonding is provided with active semiconductor elements which may be damaged in the bonding process. The method is also less suitable for the manufacture of an optical device in which it is desirable for the layer of light-conducting material to be completely plane and plane-parallel, which is very difficult to control at temperatures in excess of the softening temperature. Moreover, if a crystalline optical material or quartz glass is used in the optical device the softening temperature is so high that the known method cannot be applied A layer of quartz glass can also be obtained by means of an alternative method, for example by means of chemical deposition from the vapor phase; however, in this case it is difficult to obtain a layer of a sufficiently high optical quality. It is possible to grow a layer of silicon dioxide on a silicon substrate by means of oxidation, but it is difficult to obtain a layer which has a sufficient thickness, for example, in excess of 10 μm.

SUMMARY OF THE INVENTION

An object of the invention is to provide a method of manufacturing an optical device with a wide choice of suitable substrates, in particular, a substrate which is provided with an electric or electronic device, for example a semiconductor device. A further object of the invention is to provide a method by means of which a completely plane-parallel layer of a light-conducting material of high optical quality can be applied to a carrier body under conditions which do not adversely affect the quality of the light-conducting material nor the semiconductor elements, if any, in the carrier body.

According to the invention, this object is achieved by a method of manufacturing a device in which a layer of a light conducting material is applied to a plane surface of a disc-shaped carrier body which is characterized in that a carrier body is obtained having completely smooth and plane main surfaces which are completely parallel to each other, a plane main surface of a disc-shaped body which is composed of the light-conducting material is brought into contact with a main surface of the carrier body to form a permanent bond, the light-conductor body is then ground mechanically to a thickness which exceeds the desired ultimate layer thickness by at least 50 μm, and said body is subsequently subjected to alternate tribochemical and mechanical polishing treatments until a layer thickness is obtained which exceeds the desired final layer thickness by approximately 10 μm, after which the body is polished tribochemically until the desired layer thickness of said light conductor body is attained.

To provide, in particular, semiconductor bodies with a plane and smooth surface two types of processing techniques are commonly used.

A first technique is purely mechanical e.g. grinding or polishing with a loose grain. Such a technique enables a high precision as regards planeness, smoothness and parallelism to be attained. With this technique, which can suitably be used to attain submicron precision, it is, however, impossible to preclude surface damage and crystal disturbance below the surface In the case of a light conductor body in which optical waveguides must be formed, surface damage and crystal disturbances are impermissible.

A second method of rendering a disc plane, and smooth is a tribochemical or mechanochemical technique. With this method a surface is obtained which is free from damage and crystal disturbances below the surface. However, the geometrical precision obtained by means of this technique is relatively low, i.e., deviations in the range of a few microns occur.

This invention provides a method by means of which a very high geometrical accuracy can be obtained, in particular as regards the planeness and parallelism of the main surfaces of the light-conductor layer (submicron precision). the surface being free from damage and crystal disturbances in the light-conductor layer being avoided.

In one embodiment of the method according to the invention, the carrier body is provided with smooth, plane and parallel main surfaces by temporarily connecting the carrier body to a support member having accurately plane and parallel main surfaces and a thickness which is at least ⅓ of the largest dimension of the carrier body, after which the free main surface of the carrier body is polished mechanically to a planeness of at least 0.5 μm. Subsequently the carrier body is detached from the support member and the polished main surface is temporarily connected to the support member, after which the other main surface of the carrier body is polished to a planeness of at least 0.5 μm and a parallelism between the main surfaces of at least 0.5 μm. The support member is preferably made of quartz glass.

By virtue of the use of a support member having a sufficient thickness, the high geometrical precision regarding planeness and parallelism of the main surfaces of the carrier body can be attained. The mechanical polishing operation using a loose grain results in a high accuracy as regards dimension and shape. The occurrence of any crystal disturbances below the surface does not adversely affect the operation of the carrier body if there is a condition of stress equilibrium in the disc, which can be obtained by subjecting both main surfaces to the same treatment, thereby avoiding warpage.

After the light-conductor body is permanently bonded to the carrier body, the light-conductor body is made thin. By applying the method according to the invention, a high geometrical precision is obtained This precision can predominantly be attributed to the mechanical grinding and polishing steps. Any crystal disturbances are removed by means of tribochemical polishing, without appreciably affecting the precision. By combining these techniques, as optimum geometrical precision and a surface free from disturbances is obtained, the final light-conductor layer having a very uniform thickness.

In a particular embodiment of the method according to the invention, the light-conductor body is made of a transparent crystalline material, for example lithium niobate ($LiNbO_3$), potassium titanate phosphate ($KTiOpO_4$), gadolinium gallium garnet or other synthetic garnet compositions.

In another suitable embodiment of the method according to the invention, the light conductor body is made of quartZ glass which is very suitable for the manufacture of an optical device. Other types of glass may alternatively be used for this purpose, for example types of glass which by means of an exchange of alkali metal ions or ion implantation can be provided with refractive index gradients in accordance with a pattern to form waveguides. The type of glass must be selected such that the coefficient of thermal expansion does not differ too much from that of the carrier material. Suitable methods of manufacturing an optical device in a glass substrate are described in the non-prepublished Netherlands Patent Application NL 8701478 and in European Patent Application EP 225558.

The method according to the invention makes it possible to provide the light conductor body, prior to bonding, with optical elements on the side of the main surface to be bonded, after which the main surface is planarized.

In a particular embodiment of the method according to the invention, in which the optical device is bonded to an electric or electronic device, the carrier body is made of a material having semiconductinq properties For this purpose, for example, Si, Ge, GaAs and InP can suitably be used.

Prior to bonding, the carrier body is preferably provided with active semiconductor elements at least on the side of the main surface to be bonded, and the main surface is planarized.

A particularly strong bond between the carrier body and the light conductor body is obtained when the conductor body is provided with a silicon oxide layer on the main surface to be bonded to the light-conductor body.

In the unprepublished Netherlands Patent Application NL 8800953, a description is given of a method in which a thin layer of a semiconductor material is applied to a carrier body in a manner which is similar to the method of the invention. If desired, the carrier body may consist of quartz glass, but in this case waveguides for the manufacture of an optical device cannot be provided.

BRIEF DESCRIPTION OF THE DRAWING

Exemplary embodiments of the invention will be explained in greater detail with reference to the accompanying drawing, in which FIG 1a–d diagrammatically shows a number of steps in the method according to the invention.

DETAILED DESCRIPTION OF THE PREFERRED EMBODIMENTS

Figure 1A:
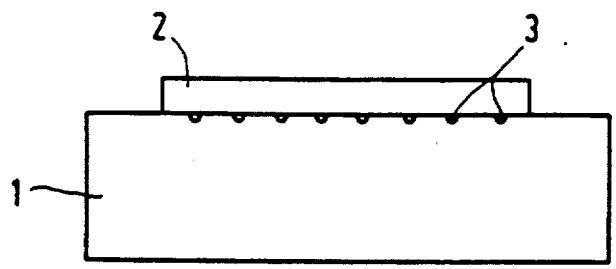

FIG. 1a shows a support member 1 on which a carrier body 2 is secured which is .o be subjected to further processing. The support member 1 preferably consists of quartz glass. Quartz glass bodies can be obtained in types having a high geometrical precision, e.g. wherein the main surfaces are very accurately parallel to each other and are perfectly plane. The thickness of the support member 1 amounts, to at east ⅛ of the largest dimension of the carrier body 2. The carrier body is mostly in the form of a cylindrical disc. By virtue of the relatively large thickness of the support member, its shape will not be subject to changes during the processing of the carrier body 2.

The carrier body 2, which is composed of silicon in the present example, is bonded to the support member preferably by means of cement If grooves 3 having a small depth are formed in the support member, the majority of the cement will be introduced into the grooves 3 when the carrier body is pressed onto the support member. The cement, which may be composed of, for example, bee's wax and a filler for example may be provided in a hot condition. On cooling, the cement shrinks and pulls the carrier body tightly against the support member. If necessary, some pressure is applied to the carrier body during the cooling of the cement.

The carrier body can also be connected to the support member in another manner. For example, an annular groove can be formed in the upper surface of the support member, the diameter of which groove is somewhat smaller than the diameter of the carrier body and the perpendicular section of which amounts to only a few micrometers. The annular groove can be vacuum exhausted via an internal duct in the support member.

The carrier body 2 may consist of a commercially available semiconductor disc comprising one or two polished main surfaces. The planeness of these discs and the parallelism of the main surfaces does not meet the requirements necessary to attain microprecision.

A first step in the method according to the invention consists in obtaining a carrier body 2 having completely smooth and plane main surfaces which are also completely parallel to each other. The carrier body 2 is secured to the support member through one of its main surfaces, for example in the above-described manner as shown in FIG. 1a. Subsequently the other main surface is polished mechanically. The mechanical polishing operation is carried out, for example, by means of $\alpha$-$Al_2O_3$ powder in water on a substrate which is composed of pitch. In this pre-polishing operation the grain size of the $\alpha$-$Al_2O_3$ powder may be 0.3 $\mu$m. Post-polishing may be carried out using $\beta$-$Al_2O_3$ powder having a grain size of 0.05 $\mu$m. In all, approximately, 10 to 25 $\mu$m is polished and the polished main surface obtained is completely parallel to the support surface.

The polished main surface is attached to the support member after the carrier body has been detached from the support member, and the other main surface is polished in a similar manner. After this treatment, a carrier body is obtained having parallel main surfaces wherein the variation in thickness over the entire carrier body having a diameter of, for example, 10 cm is less than 0.5 $\mu$m. The smoothness is such that deviations from the average value are smaller than 5 nm, preferably smaller than 0.5 nm.

Figure 1B:
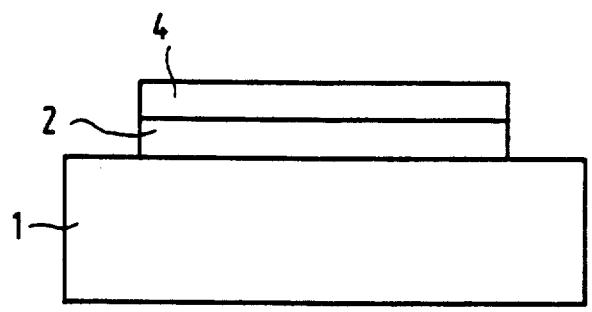

FIG. 1b shows the support member 1 and the carrier body 2 connected thereto, which carrier body is connected to a light-conductor body or disc 4 having a thickness of, for example, 0.5 mm and a diameter of 10 cm. The light conductor disc 4 is rigidly connected to the carrier body through one of its main surfaces. The main surfaces to be interconnected must be completely clean and dust-free. The main surfaces are interconnected, preferably, by means of wringing. This is a van der Waals' bond which is brought about by dipoles of both surfaces. An example of such means of interconnection is described in European Patent Application EP 209173.

Figure 1C:
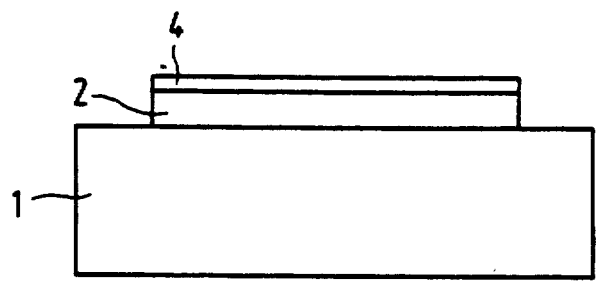

Next, the light-conductor disc 4 has to be made thin, see FIG. 1c, until a small thickness is attained which is accurately equal all over the light-conductor disc. There must be no crystal disturbances below the final surface. Subsequently, a mechanical grinding operation is carried out until a thickness of, for example, 60 μm is attained. In this manner, a surface is obtained which meets high geometrical precision demands. In order to obtain this high degree of accuracy, the mechanical grinding operation is carried out by means of, for example, silicon carbide grains in an aqueous solution. At this stage, the subsurface is damaged. The depth of damage depends on the grains used and may be 25 μm.

In a next step, the surface damage is removed by means of tribochemical polishing. Tribochemical polishing is carried out using, for example, $SiO_2$ grains having an average grain size of 30 nm in a NaOH solution having a pH value between 10 and 11. The polishing pressure may be, for example, from 300 to 500 $g/cm^2$. After polishing to approximately the depth of damage a thickness of, for example, 30 μm is attained. At this point the surface is free from damage but the geometrical precision has been adversely affected. The deviation from parallelism is, for example, 1 μm or slightly more.

Subsequently, another mechanical treatment is carried out, but this consists in a polishing method which causes very little surface damage. In this process, the depth of damage is maximally 5 μm. This fine-polishing process can be carried out by means of polishing powder $CeO_2$ having a grain size from 0.5 to 1 μm in an aqueous solution. A polishing chemotextile, for example, known under the trademark PAN-W may be used as a substrate. A pressure from 100 to 150 $g/cm^2$ is exerted and the operation is preferably carried out in a rotating manner on a double-eccentric polishing machine with a rotation difference of 25%. This fine-polishing operation by means of which a very high geometrical precision is attained can be continued until the thickness of the light-conductor disc is approximately 15 μm.

The final polishing phase is carried out tribochemically, in a manner similar to that described above, until the light conductor layer has a thickness of, for example, 10 μm. Due to the small reduction material the geometrical precision is not influenced substantially.

In principle, it does not matter which polishing step comes first. By virtue of the mechanical steps a high geometrical precision is obtained. The final polishing step is a tribochemical one in which the surface damage is completely removed. When hard materials are used there is little surface damage and the order of the polishing steps is less important and, if desirable, the final polishing step may be a mechanical one.

Figure 1D:
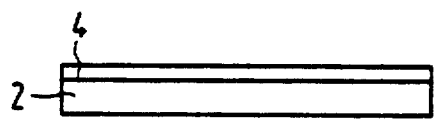

The carrier with the thin light conductor disc is subsequently detached from the support member. Thus, an assembly of components including a light conductor body (see FIG. 1d) in which optical circuits can be manufactured is obtained. For clarity, the thickness dimensions are not drawn to scale.

Within the scope of the invention, variants of the example described hereinabove are possible. For example, thickness of the support member is at least ⅓ of the diameter of the carrier. In practice, it has been found that a ratio of ¼ is especially preferred. Additionally, the temporary fixation of the carrier body is preferably carried out in the manner indicated, but may alternatively be realized in another way.

The permanent fixation of the light-conductor body to the carrier body may alternatively be carried out by means of the carrier body which has been detached from the support member. In this case, the wringing operation can be more readily mechanized. Prior to thinning the light conductor disc the combination must, however, be reconnected to the support member. Moreover, this operation of relocating the combination on the support member must be carried out with a high degree of precision.

By virtue of the mechanical polishing process the carrier body has a high degree of geometrical precision. If desired, the damage to the carrier body caused by the polishing process can also be removed by means of a tribochemical treatment.

The carrier body may be provided with active electronic elements or electronic circuits, for example for light detection. A main surface may be planarized, such that wringing on the light-conductor body is possible. If necessary, the main surface to be connected may be covered with a layer of thermal $SiO_2$ to improve the bonding to the quartz glass.

Prior to wringing, the light-conductor body may be provided with passive or active waveguides. After wringing, the device may be kept at a high temperature for some time to improve the bond. The occurrence of stresses in the light conductor layer may be counteracted by splitting the optical layer into smaller portions by etching tracks so as to form islands.

The thickness of the light conductor layer may be, for example, from 0.1 to 100 μm, and it preferably ranges from 5 to 15 μm. This layer thickness is too large to be obtained by means of growing silicon oxide, but it is too small to be provided directly in the desired thickness by applying a glass foil.

If desired, the light-conductor layer may be manufactured from an optically active material, for example crystalline transparent materials such as lithium niobate, gadolinium gallium garnet and other synthetic garnets or garnet compositions, in which waveguide structures can be formed both before and after wringing and polishing.

The optical device manufactured according to the invention may be used, for example, to couple a light conductor to a semiconductor laser or a sensor, or it may be used for transmitting signals or for combining optical and electronic devices in another manner.

We claim:

1. A method of manufacturing a device, in which a layer of a light-conducting material is applied to a plane surface of a disc-shaped carrier body, which comprises providing a carrier body having substantially completely smooth and plane main surfaces which are substantially completely parallel to each other, contacting a plane main surface of a disc-shaped body which is composed of the light-conducting material with a main surface of the carrier body to form a permanent bond, grinding the light-conductor body mechanically to a thickness which exceeds the desired ultimate layer thickness by at least 50 μm subjecting said body to alternate tribiochemical and mechanical polishing treatments until a layer thickness is obtained which exceeds the desired ultimate layer thickness by approximately 10 μm, and polishing the body tribiochemically until the desired layer thickness of said light-conductor is obtained.

2. A method as claimed in claim 1, wherein the carrier body is provided with smooth, plane and parallel main surfaces by temporarily connecting the carrier body to a support member having accurately plane and parallel main surfaces, and a thickness which is at least ⅓ of the largest dimension of the carrier body, after which the free main surface of the carrier body is polished mechanically to a planeness of at least 0.5 μm, the carrier body is detached from the support member, the polished main surface is temporarily connected to the support member, after which and the other main surface of the carrier body is polished to a planeness of at least 0 μm and a parallelism between the main surfaces of at least 0.5 μm.

3. A method as claimed in claim 2, wherein the support member is made of quartz glass.

4. A method as claimed in claim 1 wherein the light conductor body is made of a transparent crystalline material.

5. A method as claimed in claim 1 wherein the light conductor body is made of quartz glass.

6. A method as claimed in claim 4, wherein prior to bonding, the light conductor body is provided with optical elements on the side of the main surface to be bonded, and the main surface is planarized.

7. A method as claimed in claim 1 wherein the carrier body is made of a material having semiconducting properties.

8. A method as claimed in claim 7, wherein prior to bonding, the carrier body is provided with active semiconductor elements on the side of the main surface to be bonded, and the main surface is planarized.

9. A method as claimed in claim 7, wherein the carrier body is provided with a silicon oxide layer on the main surface which is to be bonded to the light-conductor body.

10. A method as claimed in claim 1 wherein the light-conductor body comprises a crystalline material selected from the group consisting of lithium niobium, potassium titanate phosphate, and gadolinium gallium garnet.

11. A method as claimed in claim 1 wherein the carrier body is made of material having semiconductive properties selected from the group consisting of Si, GE, Ga, As and

* * * * *